(12) United States Patent
Ikeda et al.

(10) Patent No.: US 10,707,154 B2
(45) Date of Patent: Jul. 7, 2020

(54) SEMICONDUCTOR DEVICE AND METHOD FOR MANUFACTURING THE SAME

(71) Applicant: Rohm Co., Ltd., Kyoto-shi, Kyoto (JP)

(72) Inventors: Masato Ikeda, Kyoto (JP); Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/238,077

(22) Filed: Jan. 2, 2019

(65) Prior Publication Data

US 2019/0214334 A1 Jul. 11, 2019

(30) Foreign Application Priority Data

Jan. 9, 2018 (JP) .................................. 2018-000954

(51) Int. Cl.
*H01L 23/495* (2006.01)
*H01L 21/48* (2006.01)
*H01L 23/00* (2006.01)

(52) U.S. Cl.
CPC .... *H01L 23/49541* (2013.01); *H01L 21/4828* (2013.01); *H01L 21/4842* (2013.01); *H01L 23/49548* (2013.01); *H01L 23/49575* (2013.01); *H01L 23/49582* (2013.01); *H01L 24/32* (2013.01); *H01L 24/45* (2013.01); *H01L 24/48* (2013.01); *H01L 24/49* (2013.01); *H01L 2224/04042* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/49173* (2013.01); *H01L 2224/73265* (2013.01)

(58) Field of Classification Search
USPC ........................................................ 257/666
See application file for complete search history.

(56) References Cited

U.S. PATENT DOCUMENTS

| 10,366,948 B2* | 7/2019 | Kasuya | ............... H01L 23/3121 |
| 10,388,616 B2* | 8/2019 | Saito | ................... H01L 23/4952 |
| 2003/0096456 A1* | 5/2003 | Yasunaga | ............ H01L 23/3107 438/124 |
| 2005/0139982 A1* | 6/2005 | Fukaya | ............. H01L 23/49548 257/690 |
| 2011/0244629 A1* | 10/2011 | Gong | .................. H01L 21/4828 438/112 |

(Continued)

FOREIGN PATENT DOCUMENTS

WO 2015/145651 A1 10/2015

*Primary Examiner* — Niki H Nguyen
(74) *Attorney, Agent, or Firm* — Hamre, Schumann, Mueller & Larson, P.C.

(57) ABSTRACT

A semiconductor device includes leads, a semiconductor element and a sealing resin covering the leads and the semiconductor element. The sealing resin includes an obverse surface, a reverse surface, and an end surface between the obverse surface and the reverse surface. The leads include a peripheral lead with a reverse surface exposed from the reverse surface of the resin and with an outer end surface exposed from the end surface of the resin. The outer end surface is located inward from the end surface of the resin. The sealing resin includes an interior top surface connected to its end surface and the outer end surface of the lead. The interior top surface and the reverse surface of the resin face in the same direction.

18 Claims, 13 Drawing Sheets

(56) References Cited

U.S. PATENT DOCUMENTS

| | | | | |
|---|---|---|---|---|
| 2012/0108013 A1* | 5/2012 | Fujisawa | ............... | H01L 21/52 |
| | | | | 438/123 |
| 2012/0248591 A1* | 10/2012 | Kure | ............... | H01L 24/29 |
| | | | | 257/676 |
| 2013/0277817 A1* | 10/2013 | Takeuchi | ............... | H01L 21/4821 |
| | | | | 257/676 |
| 2014/0084435 A1* | 3/2014 | Kimura | ............... | H01L 23/49548 |
| | | | | 257/676 |
| 2016/0056097 A1* | 2/2016 | Bai | ............... | H01L 21/4842 |
| | | | | 257/670 |
| 2016/0254214 A1* | 9/2016 | Makino | ............... | H01L 23/49582 |
| | | | | 257/676 |

\* cited by examiner

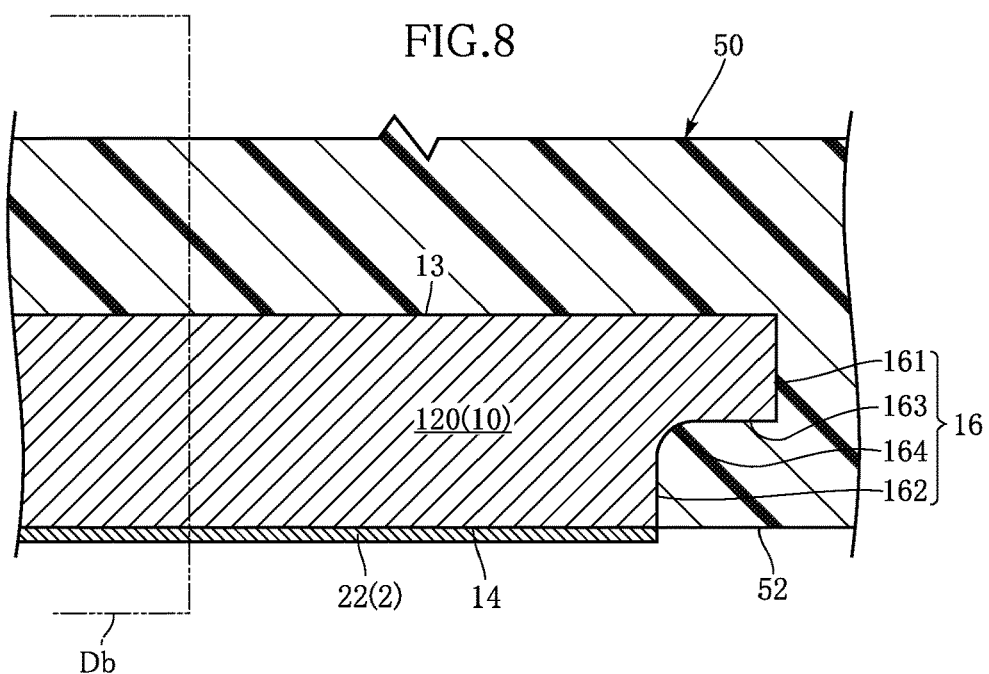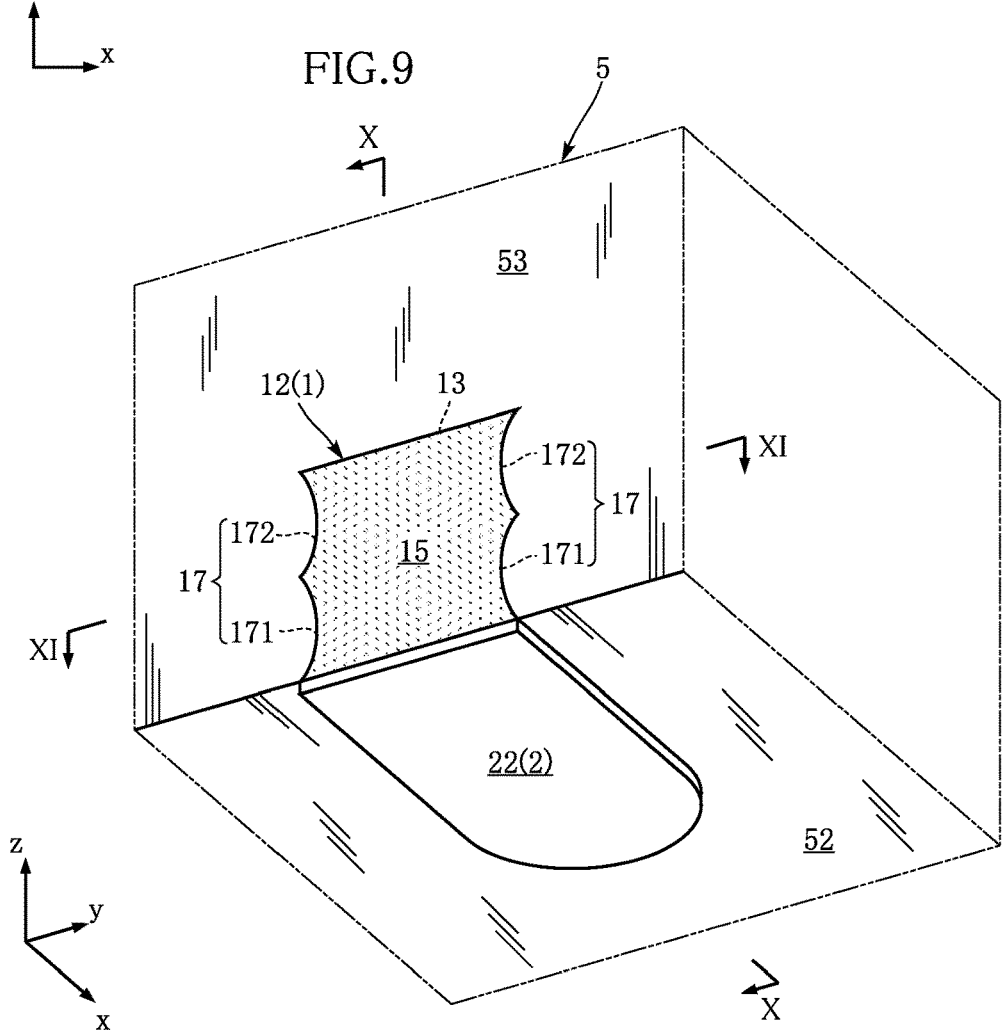

FIG.16
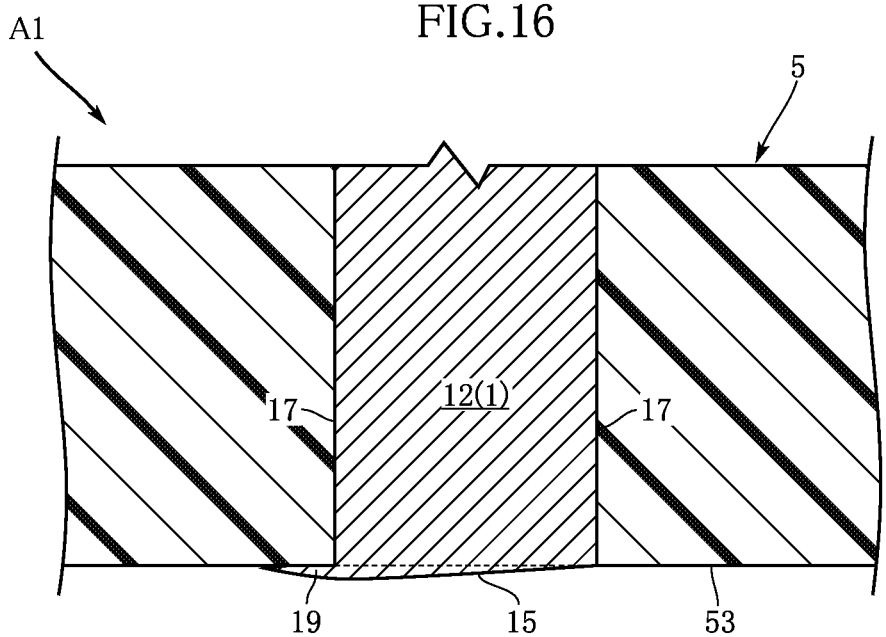
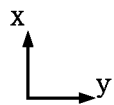
FIG.17
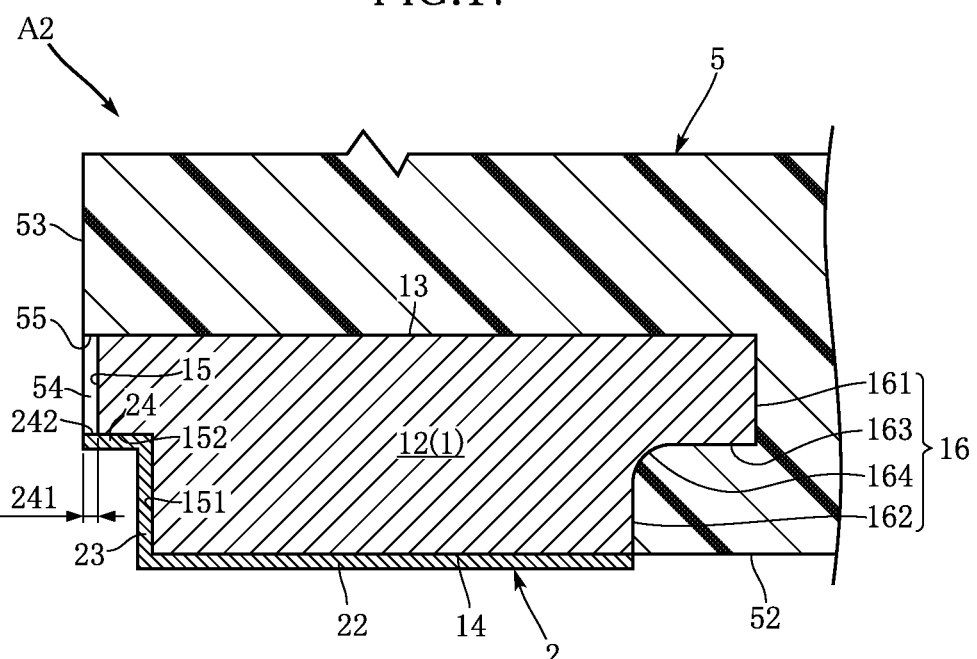
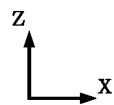

SEMICONDUCTOR DEVICE AND METHOD FOR MANUFACTURING THE SAME

FIELD

The present disclosure relates to a semiconductor device and method for manufacturing the semiconductor device.

BACKGROUND

The semiconductor device disclosed in WO2015/145651 includes a lead set including a plurality of leads, a semiconductor element mounted on the leads, and a sealing resin covering at least a part of the lead set and at least a part of the semiconductor element.

To enhance of the mounting reliability, it is preferable that solder adheres to a larger portion of the lead in mounting a semiconductor device on a circuit board.

SUMMARY

The present disclosure has been proposed in view of the above circumstances, and an object thereof is to provide a semiconductor device and a semiconductor device manufacturing method that enhance the mounting reliability.

According to a first aspect of the disclosure, there is provided a semiconductor device including: a lead set including a plurality of leads; a semiconductor element; and a sealing resin covering at least a part of the lead set and at least a part of the semiconductor element. The sealing resin includes a resin obverse surface and a resin reverse surface opposite to each other in a thickness direction, and a resin end surface located between the resin obverse surface and the resin reverse surface and extending along the thickness direction. The lead set includes a peripheral lead that has a lead reverse surface exposed from the resin reverse surface and a lead outer end surface exposed from the resin end surface. The lead outer end surface is located inward from the resin end surface in a direction perpendicular to the thickness direction. The sealing resin includes a resin interior top surface connected to the resin end surface and the lead outer end surface. The resin interior top surface and the resin reverse surface face in a same direction.

According to a second aspect of the disclosure, there is a method for manufacturing a semiconductor device, in accordance with which: a semiconductor element is mounted on a lead frame including a set of leads, a resin body is formed to cover at least a part of the lead frame and at least a part of the semiconductor element, a plating layer is formed on a portion of the lead frame that is exposed from the resin body, the lead frame and the resin body are cut to form a sealing resin and a set of leads, where the sealing resin includes a resin end surface, and the set of leads includes a peripheral lead having a lead outer end surface exposed from the resin end surface, and an etching process is performed to etch away the peripheral lead to a larger extent than the sealing resin and the plating layer such that the lead outer end surface is recessed relative to the resin end surface.

According to the present disclosure, the mounting reliability of a semiconductor device is enhanced.

Other features and advantages of the present disclosure will become apparent the detailed description given below with reference to the accompanying drawings.

DRAWINGS

FIG. 8 is a partial sectional view showing a method for manufacturing the semiconductor device according to the first embodiment of the present disclosure;

FIG. 9 is a schematic perspective view of showing the method for manufacturing the semiconductor device according to the first embodiment of the present disclosure;

FIG. 16 is a sectional view taken along line XVI-XVI in FIG. 15;

FIG. 17 is a partial sectional view showing a part of a semiconductor device according to a second embodiment of the present disclosure;

EMBODIMENTS

Figure 1:
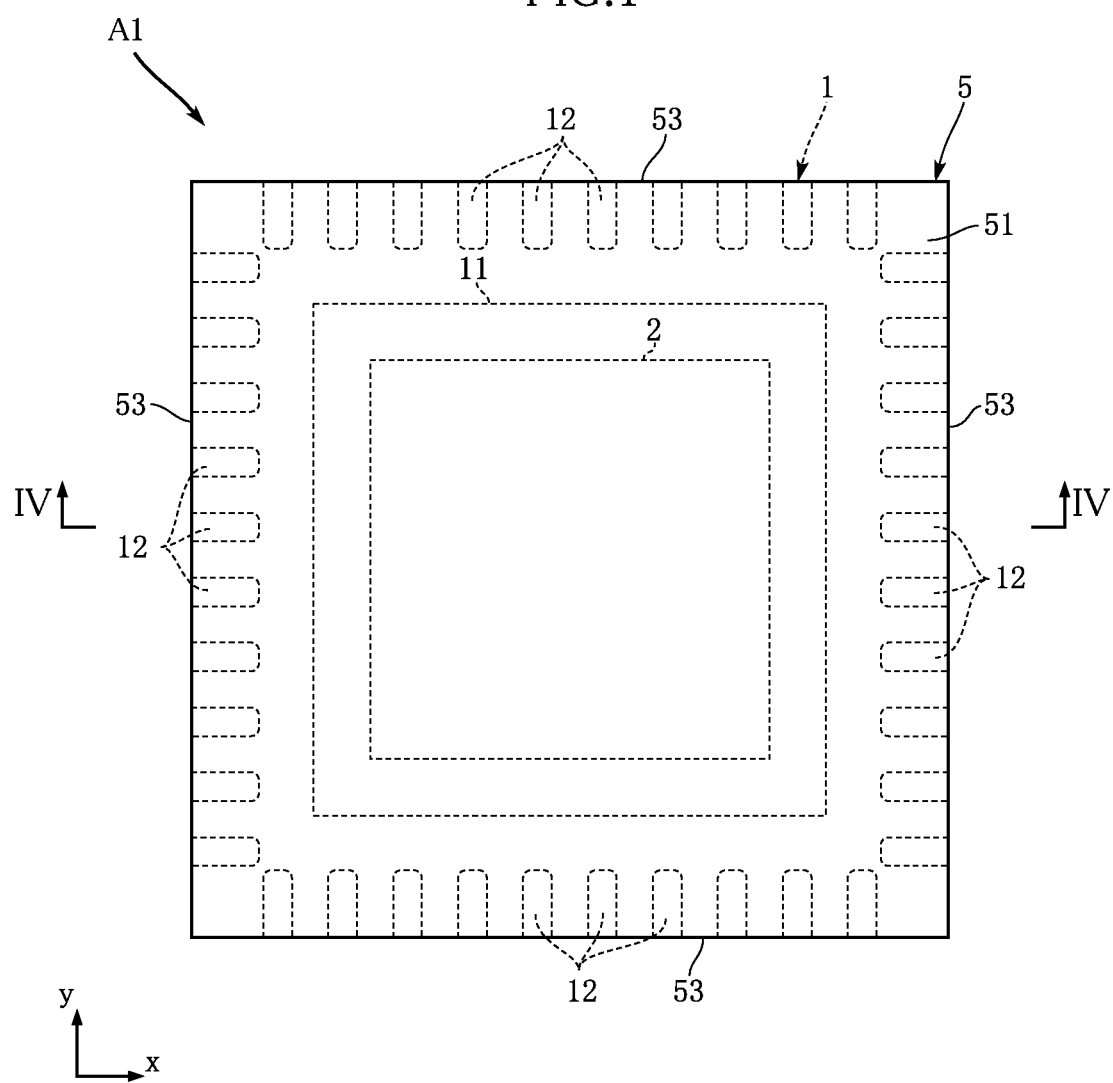
FIG. 1 is a plan view of a semiconductor device according to a first embodiment of the present disclosure.

Embodiments of the present disclosure are described below with reference to the accompanying drawings.

FIGS. 1-5 show a semiconductor device according to a first embodiment of the present disclosure. The semiconductor device A1 of the present embodiment includes a set 1 of leads, a plating layer 2, a semiconductor element 3, wires 4 and a sealing resin 5. The semiconductor device A1 of the present embodiment uses a QFN (Quad Flat Non-leaded package). However, the semiconductor device of the present disclosure is not limited to this, and various types of packages such as a SON (Small Outline Non-leaded package) may be used.

Figure 2:
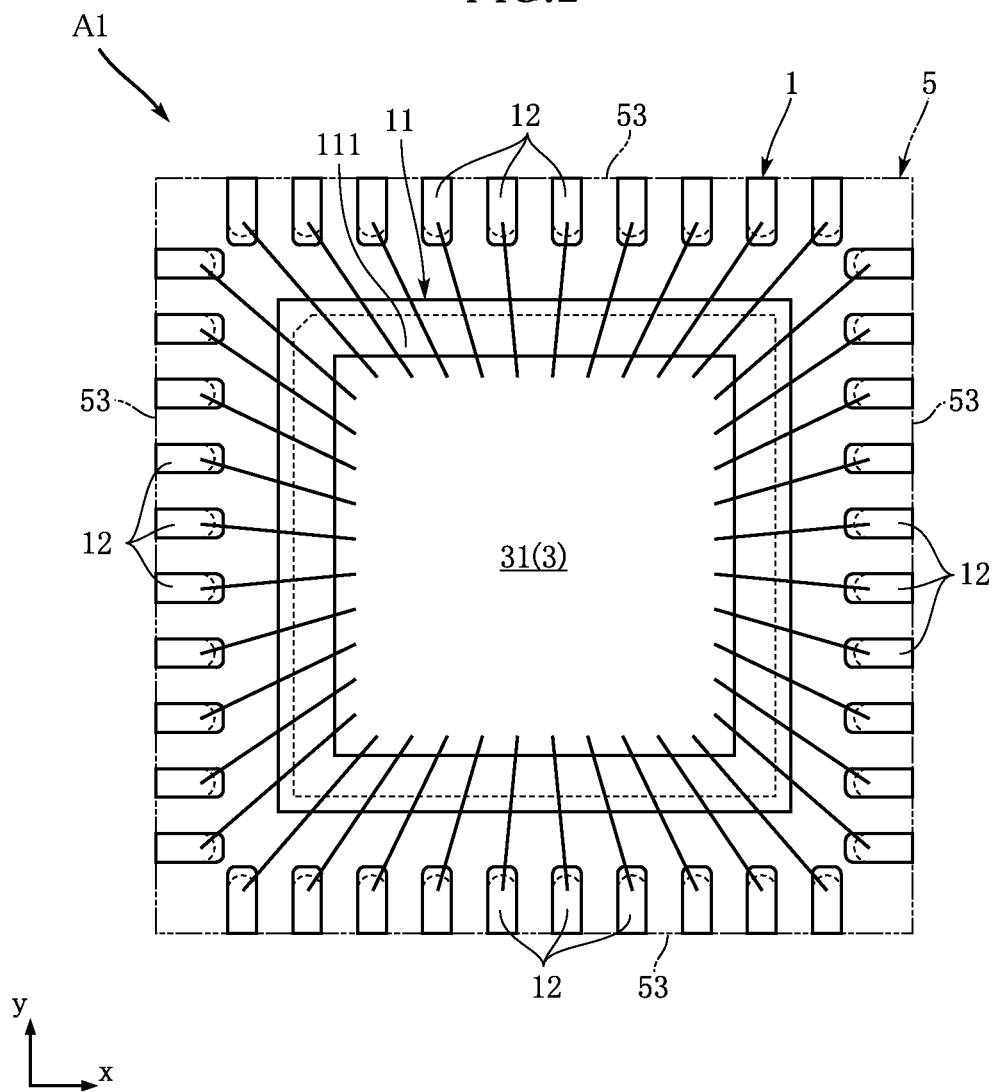
FIG. 2 is a schematic plan view of the semiconductor device according to the first embodiment of the present disclosure.
Figure 3:
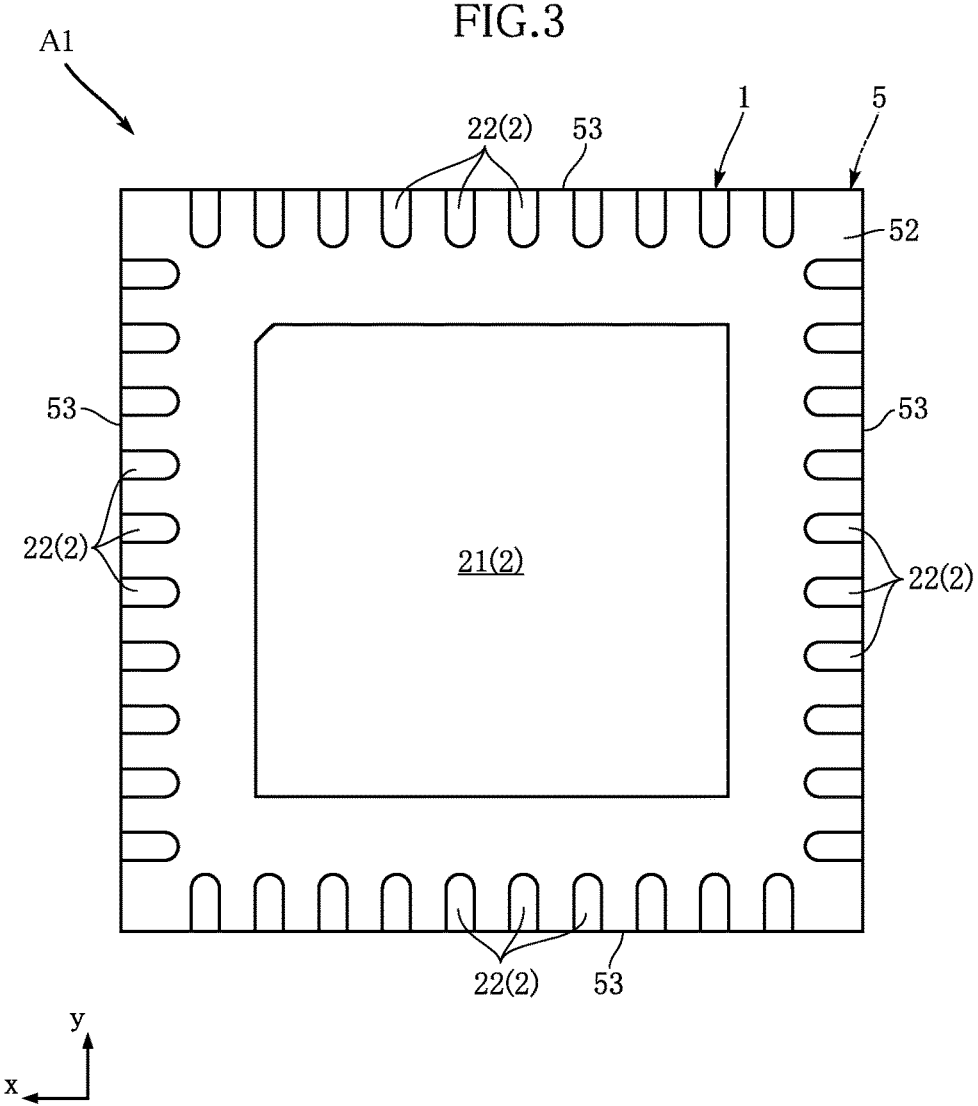
FIG. 3 is a bottom view of the semiconductor device according to the first embodiment of the present disclosure.
Figure 4:
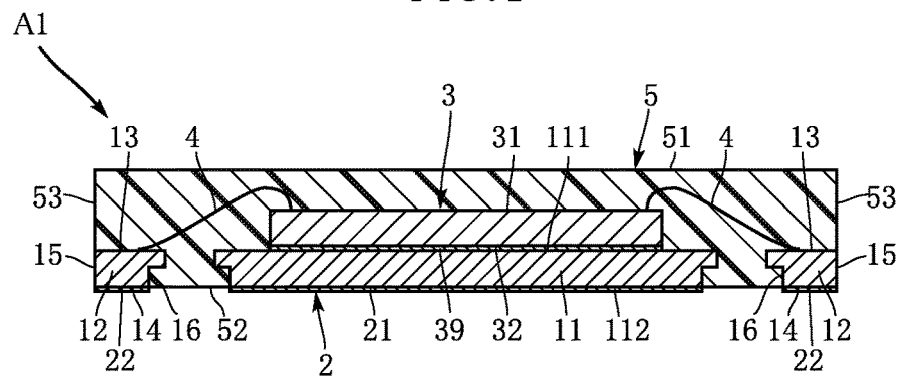
FIG. 4 is a sectional view taken along line IV-IV in FIG. 1.
Figure 5:
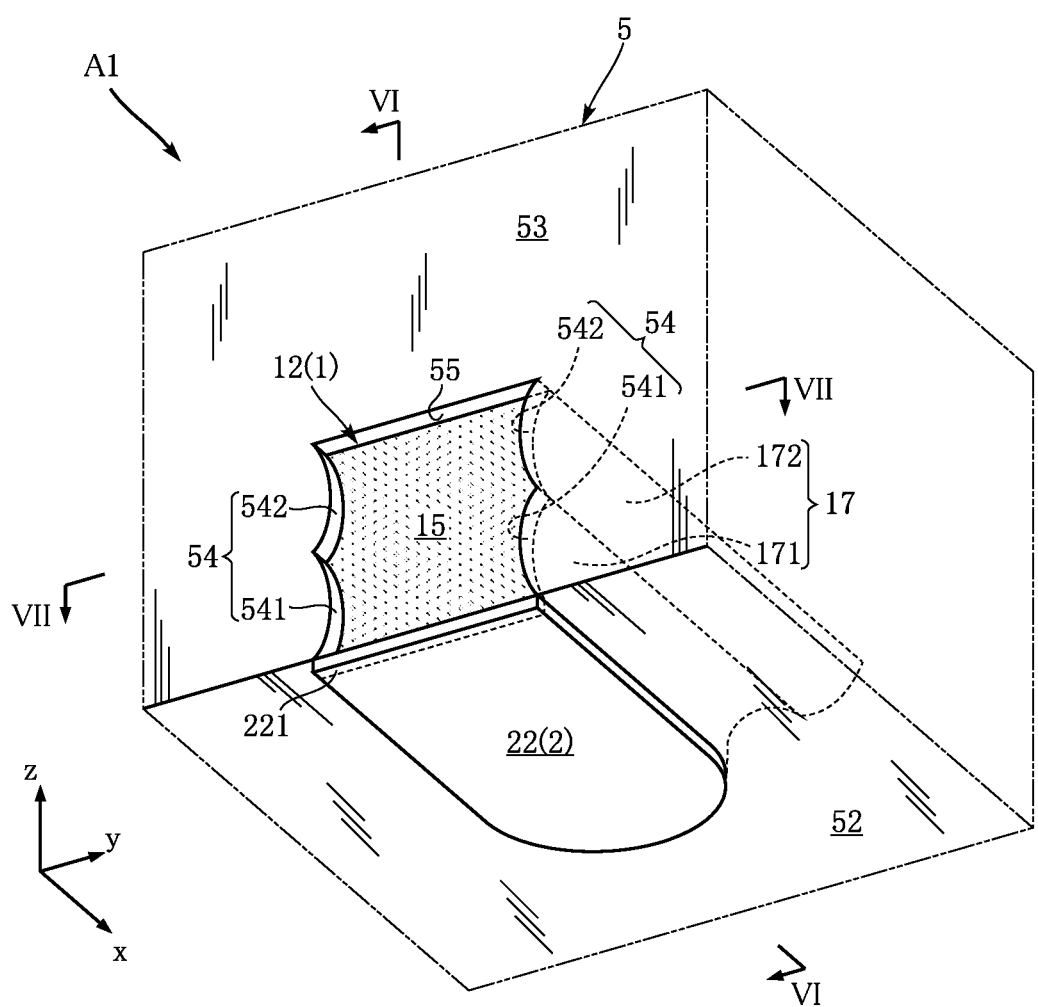
FIG. 5 is a schematic perspective view illustrating a part of the semiconductor device according to the first embodiment of the present disclosure.

FIG. 1 is a plan view showing the semiconductor device A1. FIG. 2 is a schematic plan view of the semiconductor device A1. FIG. 3 is a bottom view of the semiconductor device A1. FIG. 4 is a sectional view taken along line IV-IV in FIG. 1. FIG. 5 is a schematic perspective view illustrating a part of the semiconductor device A1. In FIG. 2, for convenience of understanding, the sealing resin 5 is indicated only by imaginary lines. The two-dot chain lines in FIG. 5 indicate the outer boundary of the above-mentioned part of the semiconductor device A1. In these figures, the z direction corresponds to the thickness direction.

The lead set 1 includes a plurality of leads. The lead set 1 supports the semiconductor element 3 and forms an electrical conduction path to the semiconductor element 3. In the present embodiment, the lead set 1 includes an island lead 11 and a plurality of peripheral leads 12. The material for the lead set 1 is not particularly limited, and various metals suitable for supporting the semiconductor element 3 and forming a conduction path to the semiconductor element 3 can be used. Examples of the metal for forming the lead set 1 include Cu, Ni, and Fe. In the example described below, the lead set 1 is made of Cu. The thickness of the lead set 1 in the z direction is not particularly limited and may be from 0.08 to 0.5 mm, for example. Examples of the typical thickness include 0.1 mm, 0.15 mm and 0.2 mm.

The island lead 11 is arranged approximately at the center of the semiconductor device A1 as viewed in the z direction. On the island lead 11, the semiconductor element 3 is mounted. The island lead 11 has an obverse surface 111 and a reverse surface 112. The obverse surface 111 faces toward a first side (upper side in FIG. 4) in the z direction. The semiconductor element 3 is mounted on the obverse surface 111. The reverse surface 112 faces toward a second side (lower side in FIG. 4) in the z direction. The island lead 11 of the present embodiment is rectangular as viewed in the z direction. Thus, the obverse surface 111 and the reverse surface 112 are rectangular. In the illustrated example, the obverse surface 111 is larger than the reverse surface 112.

The peripheral leads 12 are spaced apart from the island lead 11 and electrically connected to the semiconductor element 3 via wires 4. In the present embodiment, the peripheral leads 12 are arranged like a generally rectangular frame, forming two rows along the x direction and two columns along the y direction.

Figure 6:
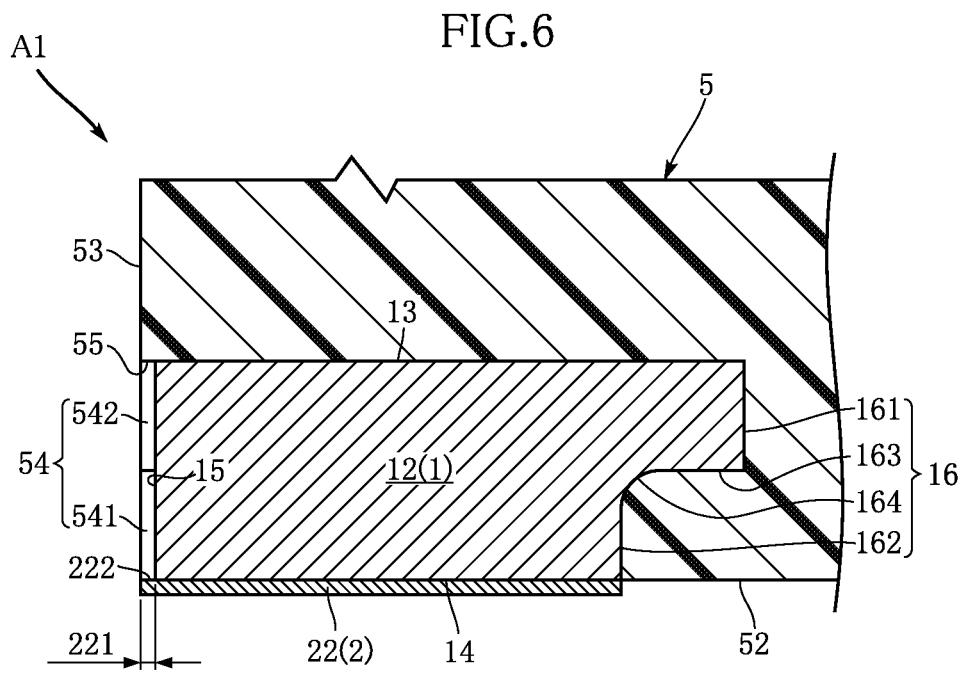
FIG. 6 is a partial sectional view taken along line VI-VI in FIG. 5.
Figure 7:
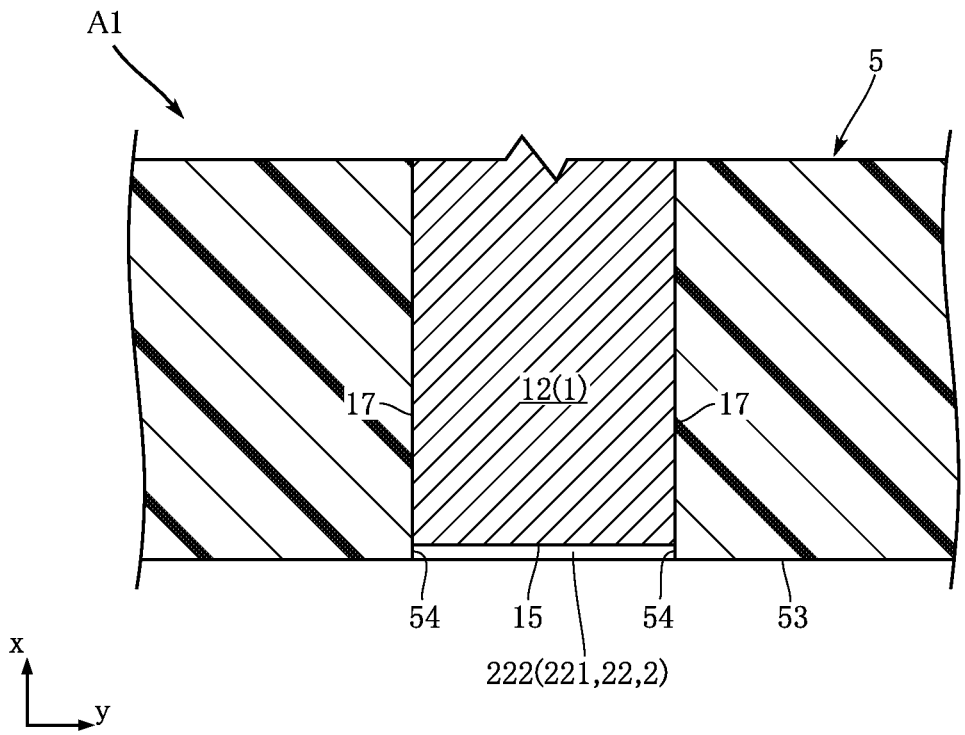
FIG. 7 is a partial sectional view taken along line VII-VII in FIG. 5.

FIGS. 5-7 show one of the peripheral leads 12 arranged along the y direction. Note that the peripheral leads 12 arranged along the x direction have the same configuration as that shown in FIGS. 5-7.

As shown in FIGS. 5-7, the peripheral lead 12 includes a lead obverse surface 13, a lead reverse surface 14, a lead outer end surface 15, a lead inner end surface 16 and a pair of lead side surfaces 17.

The lead obverse surface 13 is located on the first side (upper side in FIG. 6) in the z direction. In the illustrated example, the lead obverse surface 13 is flat. The shape of the lead obverse surface 13 is not particularly limited. In the illustrated example, the lead obverse surface 13 is elongated in the x direction.

The lead reverse surface 14 is located on the second side (lower side in FIG. 6) opposite from the lead obverse surface 13 in the z direction. In the illustrated example, the lead reverse surface 14 is flat. The shape of the lead reverse surface 14 is not particularly limited. In the illustrated example, the lead reverse surface 14 is elongated in the x direction. In the present embodiment, the dimension of the lead reverse surface 14 in the x direction is smaller than that of the lead obverse surface 13.

The lead outer end surface 15 is located on a first side (left side in FIG. 6) in the x direction. In the illustrated example, the lead outer end surface 15 is a flat surface perpendicular to the x direction. In the present embodiment, the lead outer end surface 15 is connected to the lead obverse surface 13 and the lead reverse surface 14.

The lead outer end surface 15 is formed by removing copper oxide from the surface by etching, for example. Thus, the lead outer end surface 15 is a smooth surface with less irregularities as compared with a metal surface simply obtained by cutting. The lead outer end surface 15 may be formed with an antioxidant film for preventing oxidation. Such an antioxidant film is formed by applying a predetermined film material, and can be removed by vaporization in mounting the semiconductor device A1 by soldering, for example.

The lead inner end surface 16 is located on a second side (right side in FIG. 6) in the x direction. The lead inner end surface 16 is connected to the lead obverse surface 13 and the lead reverse surface 14. In the present embodiment, since the dimension of the lead reverse surface 14 in the x direction is smaller than that of the lead obverse surface 13, the lead inner end surface 16 includes a first portion 161, a second portion 162, a third portion 163, and a fourth portion 164.

The first portion 161 is connected to the lead obverse surface 13 and faces toward the second side (right side in FIG. 6) in the x direction. The second portion 162 is connected to the lead reverse surface 14 and faces toward the second side (right side in FIG. 6) in the x direction. The third portion 163 is located between the first portion 161 and the second portion 162 and connected to the first portion 161. The third portion 163 faces toward the side to which the lead reverse surface 14 faces in the z direction. The fourth portion 164 is interposed between the second portion 162 and the third portion 163. The fourth portion 164 is concavely curved.

The paired lead side surfaces 17 are the surfaces on the opposite sides of the peripheral lead 12 in the y direction. Each of the lead side surfaces 17 is connected to the lead obverse surface 13 and the lead reverse surface 14. The specific shape of the lead side surface 17 is not particularly limited. In the illustrated example, each lead side surface 17 includes a curved portion 171 and a curved portion 172. The curved portion 171 is connected to the lead reverse surface 14, is concave in the y direction, and extends in the x direction. The curved portion 172 is connected to the lead obverse surface 13 and the curved portion 171, is concave in the y direction, and extends in the x direction.

The plating layer 2 is provided for preventing oxidation or the like of the lead set 1 or promoting adhesion of solder in mounting the semiconductor device A1. The material for the plating layer 2 is not particularly limited, but a material having a better solder wettability than the material for the lead set 1 is preferable. Examples of the material for the plating layer 2 include Sn. The thickness of the plating layer 2 is not particularly limited and may be from 3 to 20 µm, for example. A typical thickness may be 10 µm, for example. In the present embodiment, the plating layer 2 has a reverse surface portion 21 and a plurality of reverse surface portions 22.

As shown in FIGS. 3 and 4, the reverse surface portion 21 covers the reverse surface 112 of the island lead 11. In the illustrated example, the reverse surface portion 21 covers the entirety of the reverse surface 112 of the island lead 11.

As shown in FIGS. 3-6, the reverse surface portions 22 cover the lead reverse surfaces 14 of the peripheral leads 12, respectively. In the illustrated example, all of the lead reverse surfaces 14 are covered with the reverse surface portions 22. Each of the reverse surface portions 22 has a projection 221. In the case of the reverse surface portion 22 shown in FIGS. 5 and 6, the projection 221 projects in the x direction from the lower end of the lead outer end surface 15 in the direction z. The shape of the projection 221 is not particularly limited. In the illustrated example, the projection 221 extends along the entire length in the y direction of the lower end in the z direction of the lead outer end surface 15. The extremity of the projection 221 in the x direction is elongated along the y direction.

The projection 221 has an exposed surface 222. The exposed surface 222 faces toward the first side of the projection 221 (upper side in FIG. 6, or the side to which the lead obverse surface 13 faces) in the z direction.

The semiconductor element 3 is an element that performs a desired function of the semiconductor device A1. The type of the semiconductor element 3 is not particularly limited, and various elements such as integrated circuit elements, active functional elements, passive functional elements or the like are selected appropriately. As shown in FIGS. 2 and 4, in the present embodiment, the semiconductor element 3 is rectangular as viewed in the z direction.

The semiconductor element 3 has an obverse surface 31 and a reverse surface 32. The obverse surface 31 faces toward the first side (upper side in FIG. 4) in the z direction. The reverse surface 32 faces away from the obverse surface 31 in the z direction. In the present embodiment, the semiconductor element 3 is mounted on the obverse surface 111 of the island lead 11. Specifically, the reverse surface 32 of the semiconductor element 3 is bonded to the obverse surface 111 via a bonding layer 39. The bonding layer 39 may be made of a generally used insulating bonding material or electrically conductive bonding material.

The wires 4 electrically connect the semiconductor element 3 and the lead set 1. In the present embodiment, the wires 4 connect the electrode pads (not shown) formed on the obverse surface 31 of the semiconductor element 3 to the lead obverse surfaces 13 of the peripheral leads 12, respectively. The material for the wires 4 is not particularly limited. Examples of the material for the wires 4 include Au, Al and Cu. In the present embodiment, the wires 4 are made of Au.

The sealing resin 5 covers at least a part of the lead set 1 and at least a part of the semiconductor element 3 for protection. The sealing resin 5 covers the wires 4 as well. The material for the sealing resin 5 is not particularly limited and may be an insulating resin such as epoxy resin. In the present embodiment, the sealing resin 5 is rectangular as viewed in the direction z and has a flat shape having a thickness in the z direction.

As shown in FIGS. 1 and 3-7, the sealing resin 5 has a resin obverse surface 51, a resin reverse surface 52 and a plurality of resin end surfaces 53. The resin obverse surface 51 faces toward the first side (upper side in FIG. 4) in the z direction. In the illustrated example, the resin obverse surface 51 is a flat surface perpendicular to the z direction. The resin reverse surface 52 faces away from the resin obverse surface 51 in the z direction. In the illustrated example, the resin obverse surface 52 is a flat surface perpendicular to the z direction. The resin end surfaces 53 are located between the resin obverse surface 51 and the resin reverse surface 52 and extend along the z direction. In the present embodiment, the sealing resin 5 has four resin end surfaces 53. The four resin end surfaces 53 include a pair of resin end surfaces 53 spaced apart from each other in the x direction and extending along the y direction, and another pair of resin end surfaces 53 spaced apart from each other in the y direction and extending along the x direction.

As shown in FIGS. 1, 3 and 4, the sealing resin 5 covers the island lead 11 except the reverse surface 112. That is, the reverse surface 112 is exposed from the sealing resin 5. In the illustrated example, the reverse surface 112 is flush with the resin reverse surface 52. The entire portion of the island lead 11 exposed from the sealing resin 5, namely the entire reverse surface 112, is covered with the reverse surface portion 21 of the plating layer 2.

As shown in FIGS. 5-7, the sealing resin 5 covers the lead obverse surface 13, the lead inner end surface 16 and the paired lead side surfaces 17 of each peripheral lead 12. The lead reverse surface 14 and the lead outer end surface 15 of the peripheral lead 12 are exposed from the sealing resin 5. The lead reverse surface 14 is flush with the resin reverse surface 52. The sealing resin 5 has a resin interior top surface 55 and a pair of resin interior side surfaces 54 for each of the peripheral leads 12. That is, since the lead set 1 includes a plurality of peripheral leads 12, the sealing resin 5 has a plurality of resin interior top surfaces 55 and a plurality of pairs of resin interior side surfaces 54. As explained in relation to the peripheral leads 12, FIGS. 5-7 show one of the peripheral leads 12 arranged along the y direction and a part of the sealing resin 5 covering that peripheral lead 12. Note that the configuration of each of the peripheral leads 12 arranged along the x direction and a part of the sealing resin 5 covering that peripheral lead 12 is the same as that shown in FIGS. 5-7.

The resin interior top surface 55 is connected to the resin end surface 53 and the lead outer end surface 15, and faces toward the side to which the resin reverse surface 52 faces in the z direction. In the illustrated example, the resin interior top surface 55 is a flat surface perpendicular to the z direction. The resin interior top surface 55 is in the form of a thin rectangle elongated in the y direction. The resin interior top surface 55 adjoins the upper edge of the lead outer end surface 15 along the entire length of the upper edge.

The paired resin interior side surfaces 54 are connected to the resin end surface 53, the resin interior top surface 55 and the lead outer end surface 15. The paired resin interior side surfaces 54 are spaced apart from each other in the y direction and extend along the x direction. Specifically, the resin interior side surfaces 54 are spaced apart from each other in the y direction, while sandwiching the lead outer end surface 15 as viewed in the x direction. The shape of the paired resin interior side surfaces 54 is not particularly limited. In the illustrated example, the resin interior side surfaces 54 have a shape generally corresponding to the shape of the paired lead side surfaces 17. The resin interior side surfaces 54 adjoin the opposite side edges in the y direction of the lead outer end surface 15 along the entire length of the side edges.

Each of the resin interior side surfaces 54 has a curved portion 541 and a curved portion 542. The curved portion 541 is connected to the resin reverse surface 52 and the exposed surface 222 of the projection 221 of the plating layer 2. The curved portion 541 is convex inward in the y direction and extends along the x direction. The curved portion 542 is connected to the curved portion 541 and the resin interior top surface 55. The curved portion 542 is convex inward in the y direction and extends along the x direction.

In the illustrated example, the resin interior top surface 55, the paired resin interior side surfaces 54 and the exposed surface 222 have the approximately same dimension in the x direction.

An example of a method for manufacturing the semiconductor device A1 is described below with reference to FIGS. 8-11.

First, as shown in FIG. 8, a lead frame 10 for forming the lead set 1 is prepared. The lead frame 10 includes a plurality of lead sets 1, which are connected to each other by a frame part (not shown) or the like, for producing a plurality of semiconductor devices A1. Then, semiconductor elements 3 are mounted on the island leads 11 contained in the lead frame 10 by using bonding layers 39. Further, wires 4 are bonded to the semiconductor elements 3 and the lead frame 10.

Then, a resin body 50 is formed to cover at least a part of the lead frame 50 and at least a part of each semiconductor element 3. Specifically, the resin body 50 is formed by injecting a resin material into a cavity of a mold that houses the semiconductor elements 3 and the wires 4 and then curing the resin material. Thus, the resin body 50 having a resin obverse surface 51 and a resin reverse surface 52 is obtained. The reverse surfaces 112 of the island leads 11 are exposed from the resin reverse surface 52 of the resin body 50. FIG. 8 shows one of lead parts 120 contained in the lead frame 10. The lead parts are to become the peripheral leads 12. Each lead part 120 includes the lead obverse surface 13, the lead reverse surface 14, the lead inner end surface 16, and paired lead side surfaces 17. The lead reverse surface 14 of the lead part 120 is exposed from the resin reverse surface 52 and flush with the resin reverse surface 52.

Then, a plating layer 2 is formed on portions of the lead frame 10 that are exposed from the resin body 50. The plating method for forming the plating layer 2 is not particularly limited. For example, the plating layer 2 may be formed by electroplating. In this way, the plating layer 2 is formed that includes the reverse surface portions 21 covering the reverse surfaces 112 of the island leads 11 and reverse surface portions 22 covering the lead reverse surfaces 14 of the lead parts 120.

Figure 10:
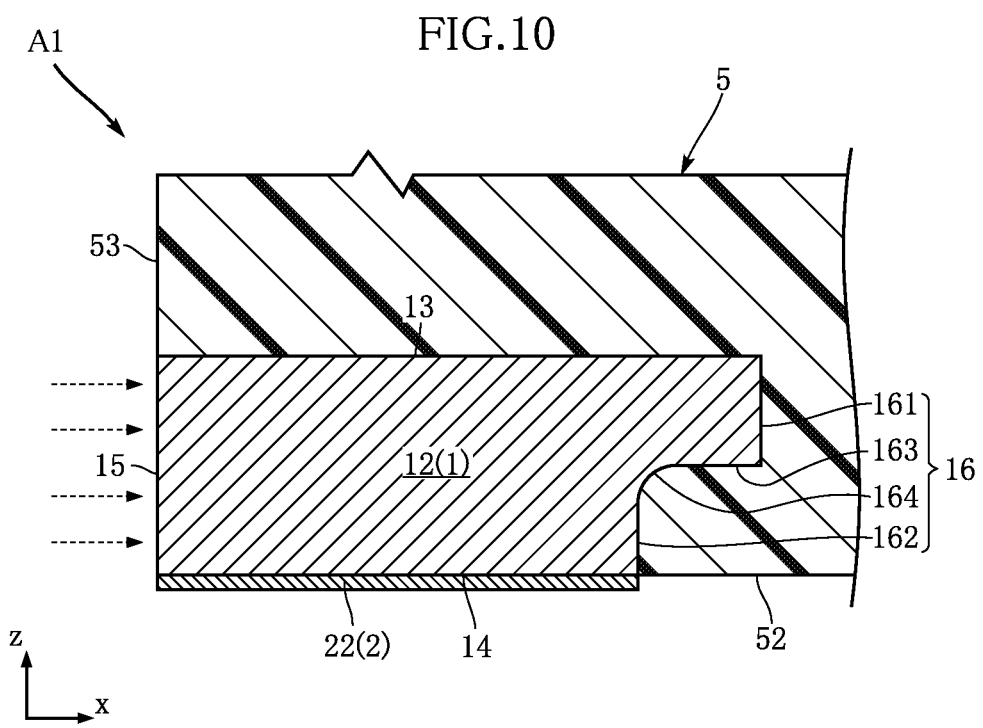
FIG. 10 is a partial sectional view taken along line X-X in FIG. 9.
Figure 11:
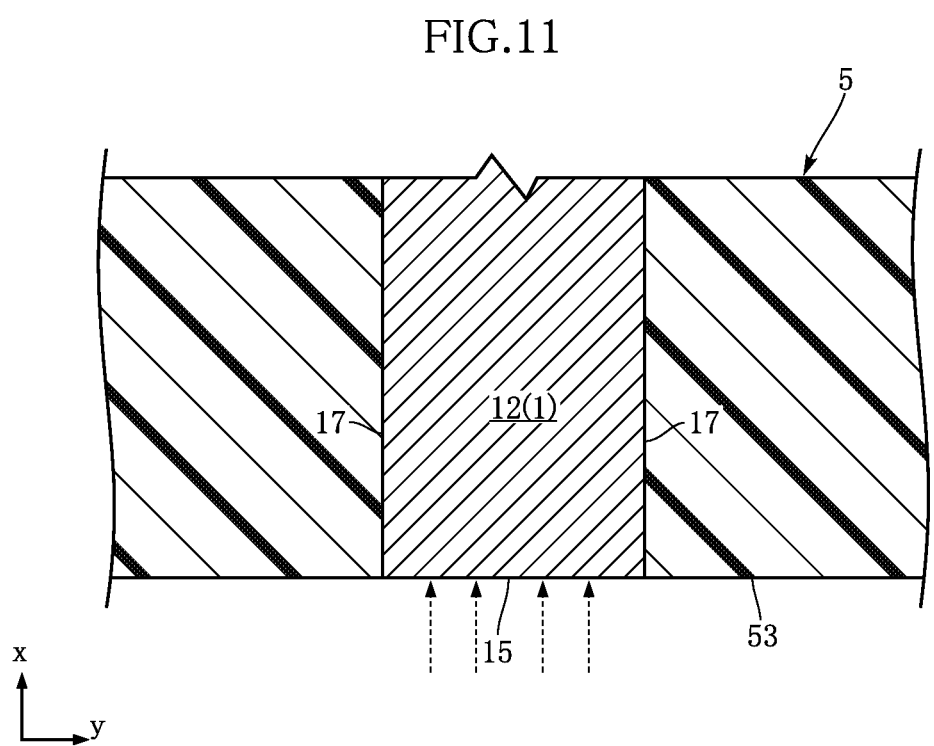
FIG. 11 is a partial sectional view taken along line XI-XI in FIG. 9.

Then, the lead frame 10 and the resin body 50 are cut. This cutting is performed along the entire length of the lead frame 10 and the resin body 50 in the z direction with a dicing blade Db shown in the figure, for example. By this cutting process, the resin body 50 is divided into a plurality of sealing resins 5 each having a resin end surface 53 as shown in FIGS. 9-11. Also, the lead parts 120 become the peripheral leads 12 each having a lead outer end surface 15. In this way, the lead set 1 including the island lead 11 and the peripheral leads 12 is obtained. In the illustrated state of the illustrated example, the resin end surface 53 and the lead outer end surface 15 are flush with each other. The extreme end surface of the reverse surface portion 22 of the plating layer 2 can be flush with the resin end surface 53 and the lead outer end surface 15.

Then, as shown in FIGS. 10 and 11, an etching process is performed to etch away the peripheral lead 12 to a larger extent than the sealing resin 5 and the plating layer 2 such that the lead outer end surface 15 is recessed relative to the resin end surface 53. In this way, the lead outer end surface 15 shown in FIGS. 5-7 is obtained. The distance by which the lead outer end surface 15 is recessed from the resin end surface 53 (the distance in the x direction in FIG. 5) is set appropriately by selecting the suitable etchant, temperature and immersion time. In the illustrated example, the distance by which the lead outer end surface 15 is recessed is from 5 to 10 μm, for example.

By the etching process, the resin interior top surface 55 and the paired resin interior side surfaces 54 are formed in the sealing resin 5. The resin interior top surface 55 is the portion of the sealing resin 5 that was in contact with the island lead 11 of the peripheral lead 12. The paired resin interior side surfaces 54 are the portions of the sealing resin 5 that were in contact with the paired lead side surfaces 17 of the peripheral lead 12.

By the etching process, the projection 221 having the exposed surface 222 is formed in the plating layer 2. The projection 221 (exposed surface 222) is the portion that was in contact with the portion of the lead reverse surface 14 of the peripheral lead 12 that is later removed by etching.

Thereafter, processing such as forming an antioxidant film on the lead outer end surface 15 is performed, so that the semiconductor device A1 is obtained.

The advantages of the semiconductor device A1 and method for manufacturing the semiconductor device A1 are described below.

Figure 12:
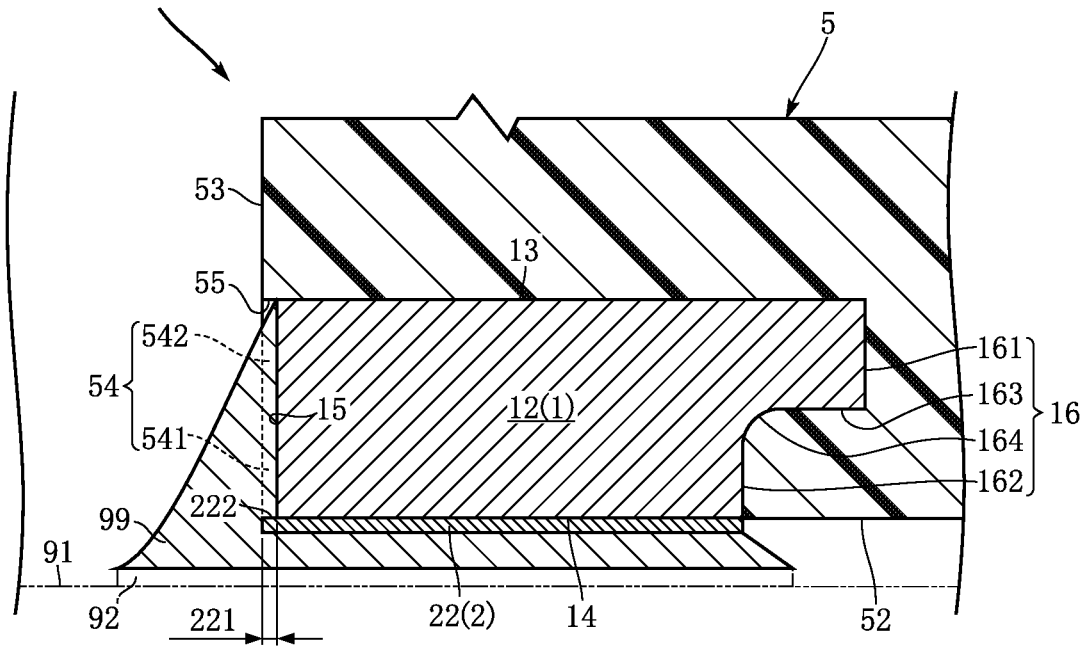
FIG. 12 is a partial sectional view showing an example of use of the semiconductor device according to the first embodiment of the present disclosure.

According to the present embodiment, as shown in FIGS. 5-6, the peripheral lead 12 has the lead outer end surface 15 exposed from the resin end surface 53. The lead outer end surface 15 is recessed relative to the resin end surface 53 to such a degree that the resin interior top surface 55 is formed in the sealing resin 5. The lead outer end surface 15 having such a configuration is formed by subjecting the lead outer end surface 15 that is flush with the resin end surface 53 to etching or the like to recess the lead outer end surface 15. Thus, an oxide film or the like is unlikely to be present on the lead outer end surface 15, so that the lead outer end surface 15 is unlikely to have undesirable irregularities. As shown in FIG. 12, in mounting the semiconductor device A1 onto the wiring pattern 92 on a substrate 91 with solder 99, the solder 99 adheres up to the boundary between the lead outer end surface 15 and the sealing resin 5 (or to resin interior top surface 55). In this way, the solder 99 adheres to a large area of the peripheral lead 12, which enhances the bonding reliability of the semiconductor device A1.

The peripheral lead 12 is covered with the reverse surface portion 22 of the plating layer 2. The plating layer 2 is made of a material having a better solder wettability than the peripheral lead 12. Thus, the semiconductor device A1 is reliably bonded by the solder 99.

The reverse surface portion 22 has the projection 221. In the example shown in FIG. 12, the projection 221 projects from the lead outer end surface 15 in the x direction. Such a configuration increases the contact area between the plating layer 2 and the solder 99. Moreover, since the projection 221 is caught in the solder 99, the bonding strength is enhanced. Moreover, since the projection 221 has the exposed surface 222, the bonding strength is further enhanced.

The extreme end surface of the projection 221 is flush with the resin end surface 53 in the z direction. Thus, although the projection 221 projects from the lead outer end surface 15, it does not project largely from the resin end surface 53. This prevents an excessively large force from exerting on the projection 221 via the solder 99.

The sealing resin 5 having the paired resin interior side surfaces 54 allows the solder 99 to enter the region surrounded by the resin interior top surface 55 and the resin interior side surfaces 54. This enhances the mounting strength.

Since the lead outer end surface 15 is a flat surface, molten solder 99 readily adheres to the surface.

Since the lead outer end surface 15 is connected to the lead obverse surface 13 and the lead reverse surface 14, it is possible to apply the solder 99 such that it adheres from the lead reverse surface 14 to approximately the same height as the lead obverse surface 13 as viewed in the x direction. That is, the adhesion height of the solder 99 on the lead outer end surface 15 can be made approximately the same as the dimension of the peripheral lead 12 in the z direction, which is favorable for enhancing the bonding strength.

As shown in FIGS. 9-11, the lead outer end surface 15 recessed from the resin end surface 53 is reliably formed by cutting the resin body 50 and the lead part 120 to form the resin end surface 53 and the lead outer end surface 15 that are flush with each other and then selectively etching away the lead outer end surface 15 alone. Etching is favorable for recessing the lead outer end surface 15 from the resin end surface 53 by a desired amount.

FIGS. 13 to 22 illustrate variations and other embodiments of the present disclosure. In these figures, the elements that are identical or similar to those of the foregoing embodiment are designated by the same reference signs as those used for the foregoing embodiment.

Figure 13:
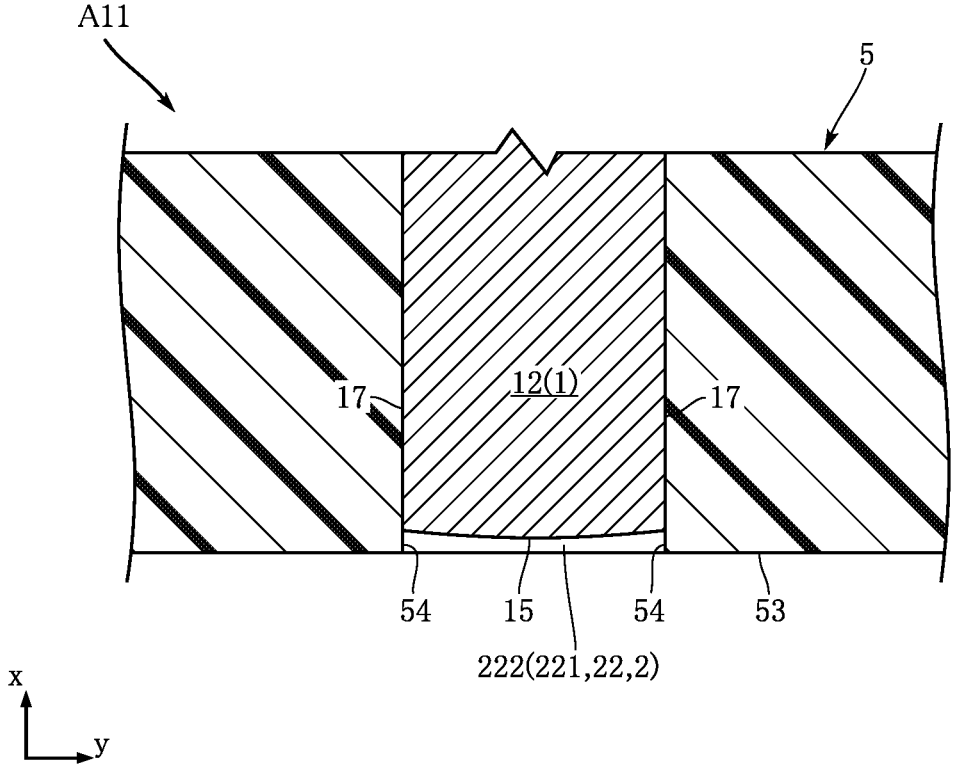
FIG. 13 is a partial sectional view showing a first variation of the semiconductor device according to the first embodiment of the present disclosure.

FIG. 13 is a sectional view showing a part of a first variation of the semiconductor device A1. In the semiconductor device A11 of this variation, the lead outer end surface 15 is a curved surface. Specifically, the lead outer end surface 15 is a convex surface gently curved outward in the x direction. That is, the lead outer end surface 15 is located more inward in the x direction as it approaches the paired resin interior side surfaces 54.

The semiconductor device A11 according to this variation also achieves enhanced mounting reliability. As will be understood from this variation, the shape of the lead outer end surface 15 can be changed in various ways by appropriately selecting the etching conditions or the like for recessing the lead outer end surface 15.

Figure 14:
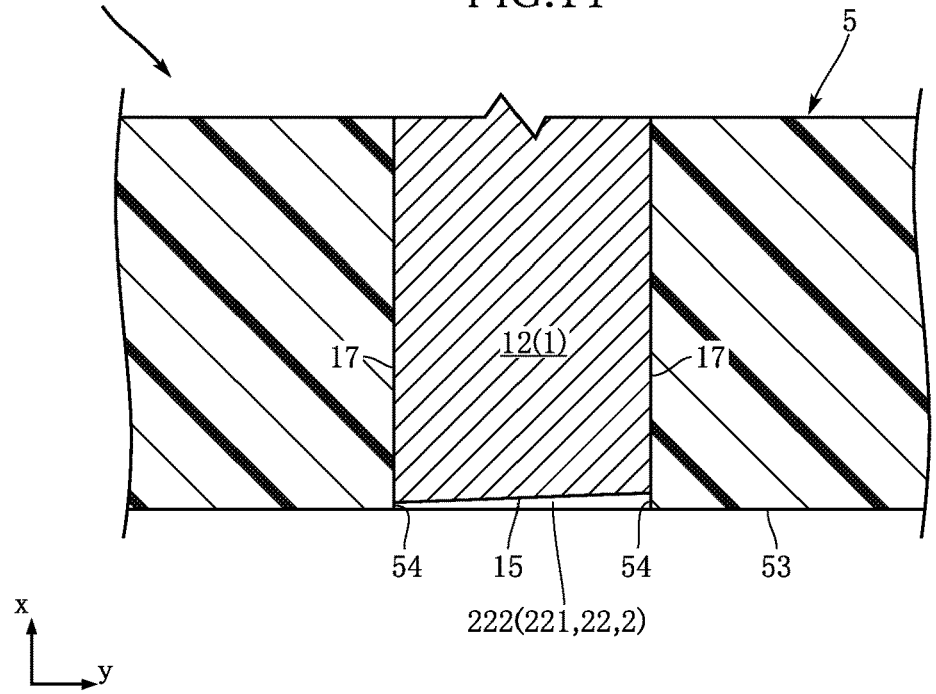
FIG. 14 is a partial sectional view showing a second variation of the semiconductor device according to the first embodiment of the present disclosure.

FIG. 14 is a sectional view showing a part of a second variation of the semiconductor device A1. In the semiconductor device A12 of this variation, the lead outer end surface 15 is slightly inclined with respect to the x direction. Specifically, the lead outer end surface 15 is inclined to be located inward in the x direction as proceeding from left to right in the y direction in FIG. 14.

Figure 15:
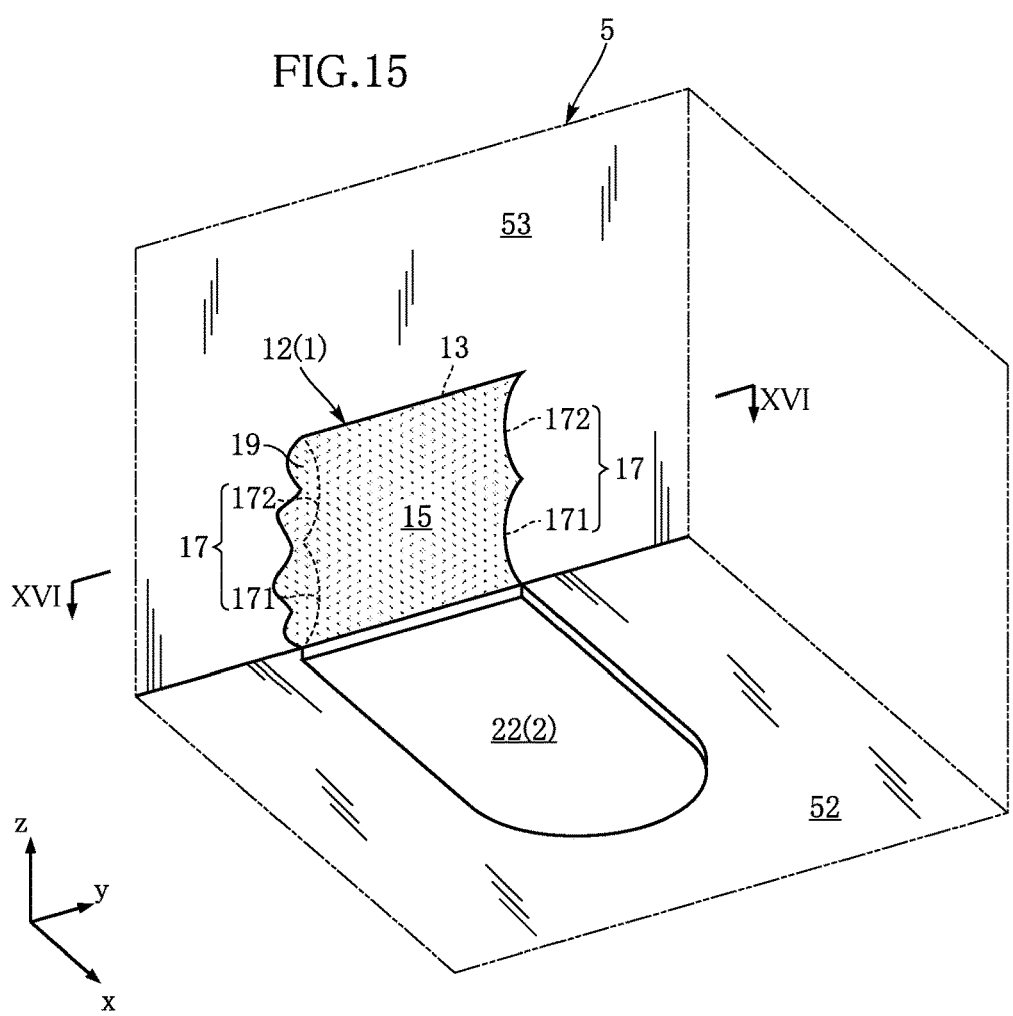
FIG. 15 is a schematic perspective view showing a method for manufacturing the second variation of the semiconductor device according to the first embodiment of the present disclosure.

FIGS. 15 and 16 show a step of a method for manufacturing the semiconductor device A12. These figures show the state after the resin body 50 and the lead parts 120 are cut. In this example, a burr 19 is formed on the peripheral lead 12 due to cutting conditions or the like. The burr 19 is a part of the peripheral lead 12 that has extended out to adhere to the resin end surface 53 due to the searing stress or the like exerted during the cutting process. When etching is performed to the peripheral lead 12 having such a burr, the removal of the material is delayed on the side formed with the burr 19 (the left side in the y direction in the figure). As a result, the semiconductor device A12 has the lead outer end surface 15 inclined as shown in FIG. 14.

FIG. 17 is a sectional view showing apart of a semiconductor device according to a second embodiment of the present disclosure. The semiconductor device A2 of the present embodiment differs from the foregoing embodiment in configuration of the peripheral leads 12.

In the present embodiment, each of the peripheral lead 12 has a lead interior side surface 151 and a lead interior top surface 152. The lead interior side surface 151 is connected to the lead reverse surface 14 and extends along the z direction. The lead interior side surface 151 is located inward from the lead outer end surface 15 in the x direction. The lead interior top surface 152 is connected to the upper edge in the z direction of the lead interior side surface 151 and the lower edge in the direction z of the lead outer end surface 15. In the illustrated example, the lead interior top surface 152 faces downward in the z direction. Note that a curved portion may be interposed between the lead interior side surface 151 and the lead interior top surface 152.

In the present embodiment, the plating layer 2 has an interior side surface portion 23 and an interior top surface portion 24. The interior side surface portion 23 is connected to the reverse surface portion 22 and covers the lead interior side surface 151 of the peripheral lead 12. The interior top surface portion 24 is connected to the interior side surface portion 23 and covers the lead interior top surface 152 of the peripheral lead 12.

The plating layer 2 of the present embodiment has a projection 241. Similarly to the projection 221 of the foregoing embodiment, the projection 241 projects in the x direction from the lower end in the direction z of the lead outer end surface 15. The shape of the projection 241 is not particularly limited. In the illustrated example, the projection 241 extends along the entire length in the y direction of the lower end in the z direction of the lead outer end surface 15. Further, the extremity of the projection 221 in the x direction is elongated along the y direction.

The projection 241 has an exposed surface 242. The exposed surface 242 faces toward the first side of the projection 241 (upper side in FIG. 17, or the side to which the lead obverse surface 13 faces) in the z direction.

FIGS. 18-21 show an example of a method for manufacturing the semiconductor device A22.

Figure 18:
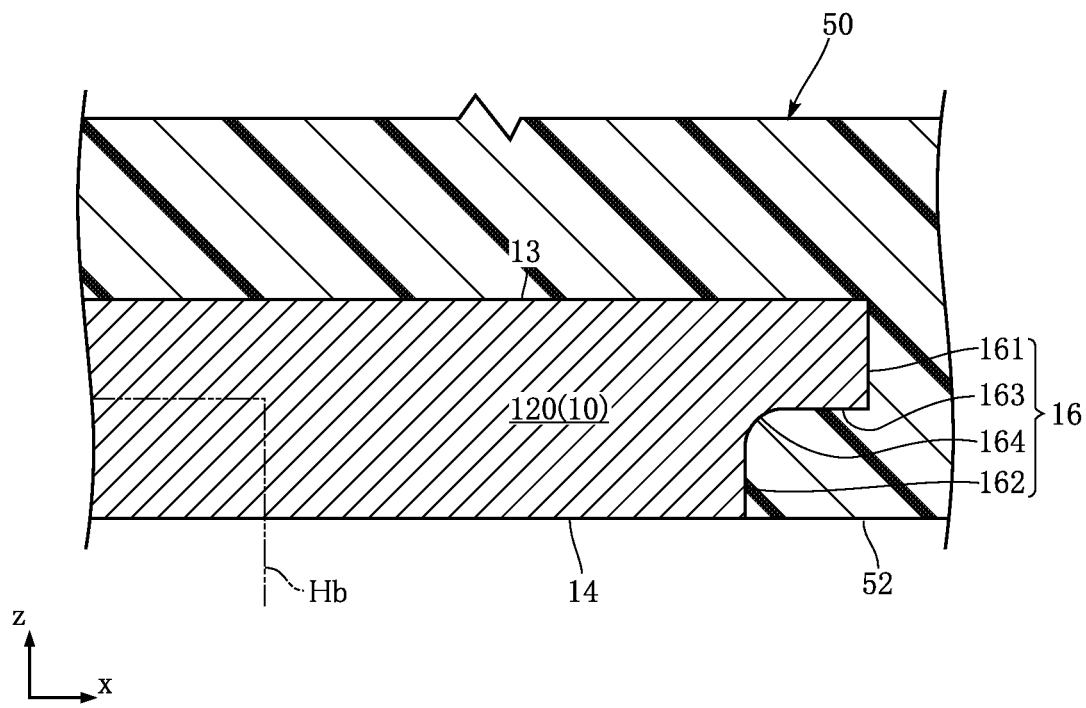
FIG. 18 is a partial sectional view showing a method for manufacturing the semiconductor device according to the second embodiment of the present disclosure.
Figure 19:
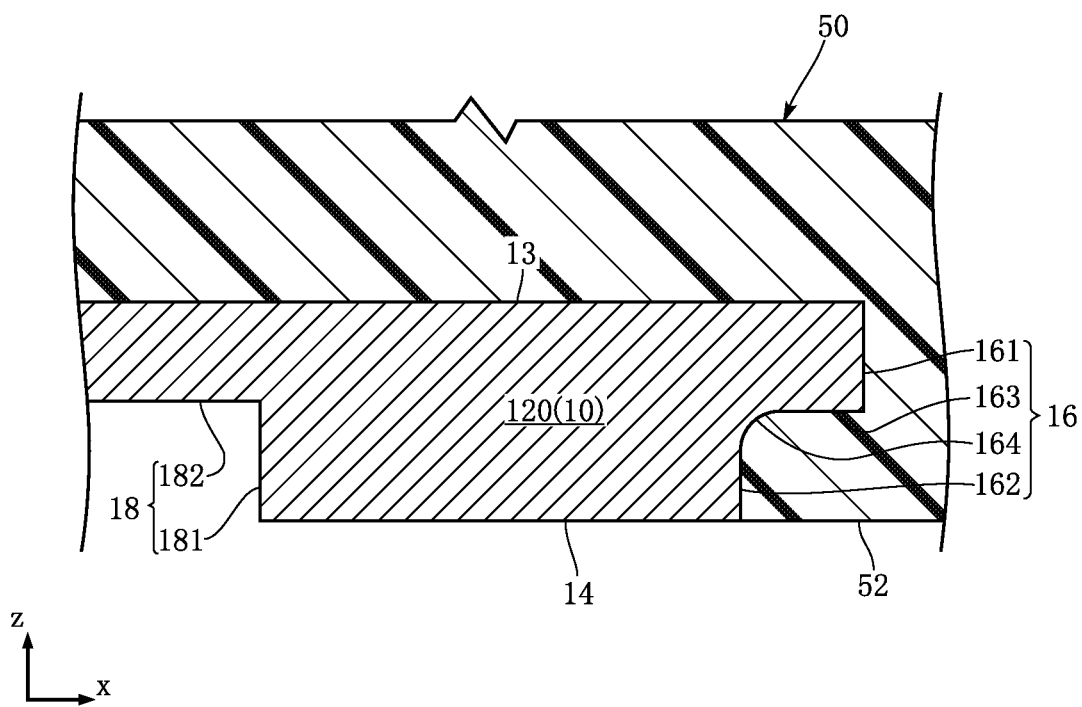
FIG. 19 is a partial sectional view showing the method for manufacturing the semiconductor device according to the second embodiment of the present disclosure.

First, semiconductor elements 3 are mounted on a lead frame 10, and wires 4 are bonded. Then, a resin body 50 is formed as shown in FIG. 18. Then, a portion of each lead part 120 is removed by cutting in the z direction from below with a half cut blade Hb. As a result, the groove 18 as shown in FIG. 19 is formed.

The groove 18 is recessed from the lead reverse surface 14 of the lead part 120 upward in the z direction and has an interior side surface 181 and a bottom surface 182. The interior side surface 181 is connected to the lead reverse surface 14 and extends along the z direction. Note that the figure shows only a part of the groove 18, and the groove 18 has a pair of bottom surfaces 182 facing each other. The bottom surfaces 182 are connected to a pair of interior side surfaces 181 and face downward in the z direction.

Figure 20:
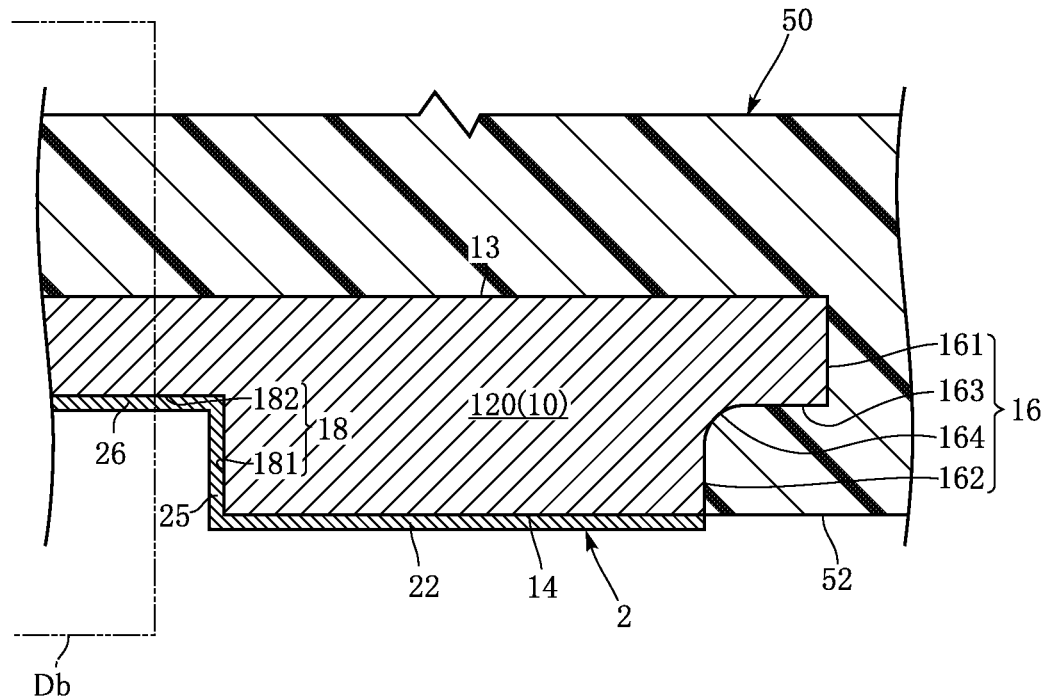
FIG. 20 is a partial sectional view showing the method for manufacturing the semiconductor device according to the second embodiment of the present disclosure.

Then, a plating layer 2 is formed as shown in FIG. 20. In the present embodiment, the plating layer 2 has an interior side surface portion 25 and a bottom surface portion 26, in addition to the reverse surface portion 22. The interior side surface portion 25 covers the interior side surface 181 of the groove 18. The bottom surface portion 26 covers the bottom surface 182 of the groove 18.

Figure 21:
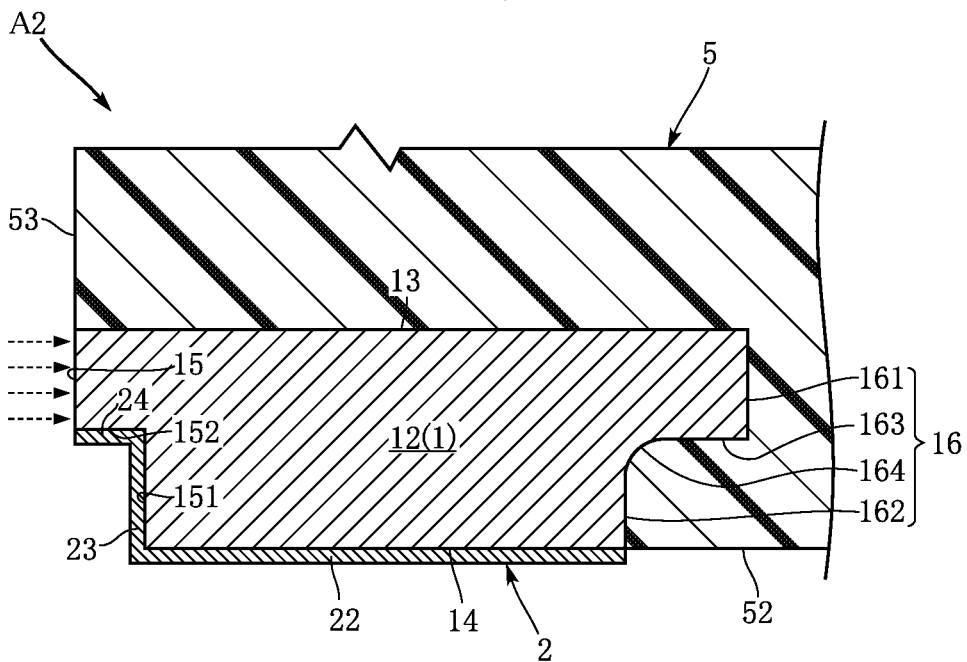
FIG. 21 is a partial sectional view showing the method for manufacturing the semiconductor device according to the second embodiment of the present disclosure.
Figure 22:
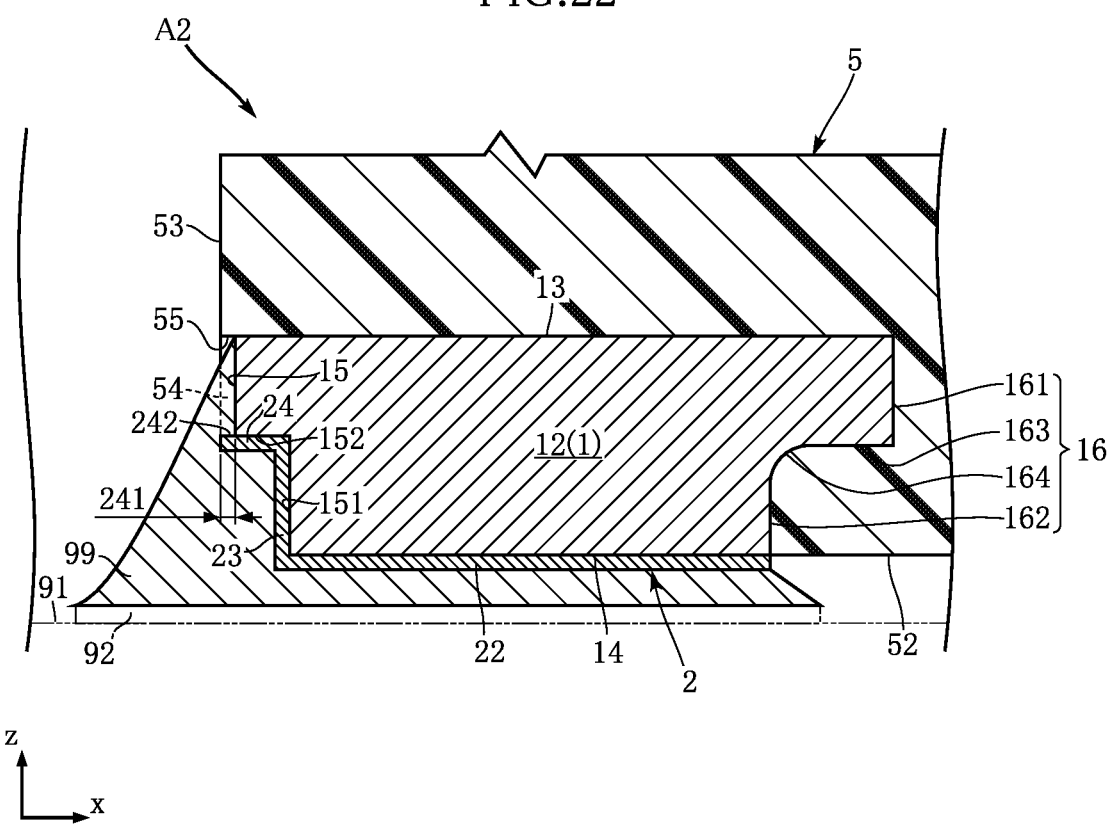
FIG. 22 is a partial sectional view showing an example of use of the semiconductor device according to the second embodiment of the present disclosure.

Then, the resin body 50 and the lead frame 10 are cut with a dicing blade Db. The dimension of the dicing blade Db in the x direction is smaller than that of the half cut blade Hb. This cutting process is performed with the dicing blade Db located between the paired interior side surfaces 181 of the groove 18. Thus, the sealing resin 5 and the peripheral lead 12 shown in FIG. 21 is obtained. Thus, the cut surface of the lead part 120 becomes the lead outer end surface 15 of the peripheral lead 12. The interior side surface 181 becomes the lead interior side surface 151, and a part of the bottom surface 182 becomes the lead interior top surface 152. The cut surface of the resin body 50 becomes the resin end surface 53. The interior side surface portion 25 becomes the interior side surface portion 23, and a part of the bottom surface portion 26 becomes the interior top surface portion 24.

Then, an etching process is performed to etch away the peripheral lead 12 to a larger extent than the sealing resin 5 and the plating layer 2 such that the lead outer end surface 15 is recessed relative to the resin end surface 53. Thus, the semiconductor device A2 having the lead outer end surface 15 shown in FIG. 17 is obtained.

The semiconductor device A2 according to the present embodiment also achieves enhanced mounting reliability. Moreover, in mounting the semiconductor device A2 onto a substrate 91 by using solder 99, the solder 99 spreads from the reverse surface portion 22 along the interior side surface portion 23, the interior top surface portion 24 and the projection 241 to the lead outer end surface 15. The reverse surface portion 22, the interior side surface portion 23, the interior top surface portion 24 and the projection 241 are made of a material having excellent solder wettability. This is favorable for causing the solder 99 to adhere to the upper end of the lead outer end surface 15.

Moreover, in the semiconductor device A2, the solder 99 adheres to the lead outer end surface 15 by spreading beyond the region where the plating layer 2 is provided. If the etching process for recessing the lead outer end surface 15 is not performed after the state shown in FIG. 21, the solder 99 cannot spread upward beyond the interior top surface portion 24, and adhesion to the lead outer end surface 15 cannot be expected. As compared with such a configuration, the present embodiment increases the adhesion amount of the solder 99.

The semiconductor device and the method for manufacturing the semiconductor device according to the present disclosure are not limited to the foregoing embodiments. The specific configuration of each part of the semiconductor device and the semiconductor device manufacturing method according to the present disclosure may be varied in many ways.

The invention claimed is:

1. A semiconductor device comprising:
   a lead set including a plurality of leads;
   a semiconductor element; and
   a sealing resin covering at least a part of the lead set and at least a part of the semiconductor element,
   wherein the sealing resin includes a resin obverse surface and a resin reverse surface opposite to each other in a thickness direction, and a resin end surface located between the resin obverse surface and the resin reverse surface and extending along the thickness direction,
   the lead set comprises a peripheral lead including a lead reverse surface exposed from the resin reverse surface and a lead outer end surface exposed from the resin end surface,
   the lead outer end surface includes a single flat surface region, an entirety of the single flat surface region being located inward from the resin end surface in a direction perpendicular to the thickness direction,
   the sealing resin includes a resin interior top surface connected to the resin end surface and the lead outer end surface, and the resin interior top surface and the resin reverse surface face in a same directiom,
   the single flat surface region of the lead outer end surface has an upper edge held in contact with the resin interior top surface.

2. The semiconductor device according to claim 1, further comprising a plating layer including a reverse surface portion covering the lead reverse surface, wherein the lead outer end surface is exposed from the plating layer.

3. The semiconductor device according to claim 2, wherein the plating layer includes a projection that projects relative to the lead outer end surface.

4. The semiconductor device according to claim 3, wherein the projection has an extreme end surface that is flush with the resin end surface as viewed in the thickness direction.

5. The semiconductor device according to claim 3, wherein the projection includes an exposed surface connected to the lead outer end surface, and said exposed surface and the resin obverse surface face in a same direction.

6. The semiconductor device accorded to claim 5, wherein the sealing resin includes a pair of resin interior side surfaces connected to the resin end surface, the resin interior top surface and the exposed surface, the resin interior side surfaces extending along a direction perpendicular to the thickness direction.

7. The semiconductor device according to claim 5, wherein the lead outer end surface is a flat surface extending along the thickness direction.

8. The semiconductor device according to claim 5, wherein the peripheral lead includes a lead obverse surface facing in a same direction as the resin obverse surface, and the lead outer end surface is connected to the lead obverse surface.

9. The semiconductor device according to claim 8, wherein the lead outer end surface is connected to the lead reverse surface.

10. The semiconductor device according to claim 9, wherein the projection is connected to the reverse surface portion.

11. The semiconductor device according to claim 5, wherein the peripheral lead includes a lead interior side surface connected to the lead reverse surface and extending along the thickness direction, and a lead interior top surface interposed between the lead interior side surface and the lead outer end surface, the lead interior top surface and the lead reverse surface face in a same direction.

12. The semiconductor device according to claim 11, wherein the plating layer includes an interior side surface portion connected to the reverse surface portion and covering the lead interior side surface, and an interior top surface portion connected to the interior side surface portion and covering the lead interior top surface.

13. The semiconductor device according to claim 12, wherein the projection is connected to the interior top surface portion.

14. The semiconductor device according to claim 2, wherein the peripheral lead is made of Cu.

15. The semiconductor device according to claim 2, wherein the plating layer comprises Sn.

16. The semiconductor device according to claim 1, wherein the lead set includes an island lead spaced apart from the peripheral lead, the semiconductor element being mounted on the island lead, and the semiconductor element is connected to the peripheral lead with a wire.

17. The semiconductor device according to claim 16, wherein the sealing resin is rectangular as viewed in the thickness direction, and the resin end surface comprises four end surfaces, and
   the peripheral lead comprises a plurality of peripheral leads arranged along the four end surfaces.

18. A method for manufacturing a semiconductor device, the method comprising:

mounting a semiconductor element on a lead frame including a set of leads, forming a resin body to cover at least a part of the lead frame and at least a part of the semiconductor element, forming a plating layer on a portion of the lead frame that is exposed from the resin body, cutting the lead frame and the resin body to form a sealing resin and a set of leads, the sealing resin including a resin end surface, the set of leads including a peripheral lead having a lead outer end surface exposed from the resin end surface, and performing an etching process to etch away the peripheral lead to a larger extent than the sealing resin and the plating layer such that the lead outer end surface is recessed relative to the resin end surface, wherein the lead outer end surface includes a flat surface region that is parallel to the resin end surface, and an entirety of the flat surface region is located inward from the resin end surface.

* * * * *